United States Patent [19]
Holmes et al.

[11] 3,724,055
[45] Apr. 3, 1973

[54] LEAD CUT AND OUTWARD CLINCH MECHANISM

[75] Inventors: Robert H. Holmes; Albert W. Zemek, both of Binghamton, N.Y.

[73] Assignee: Universal Instruments Corporation, Binghamton, N.Y.

[22] Filed: Nov. 3, 1971

[21] Appl. No.: 195,267

[52] U.S. Cl. ....................29/203 B
[51] Int. Cl. ....................H05k 13/04
[58] Field of Search ........29/203 B, 203 D, 203 DT, 29/203 DS, 203 R, 208 D

[56] References Cited

UNITED STATES PATENTS 3,670,385 6/1972 Cropp ....................29/203 B

*Primary Examiner*—Thomas H. Eager
*Attorney*—Fidelman, Wolffe & Leitner

[57] ABSTRACT

An electronic component lead cutting and outwardly clinching mechanism having a linkage arrangement whereby the component leads are severed and outwardly clinched and the remaining portion of the lead is carried out of the cutting and clinching area by an evacuation channel. The mechanism has a three stage linkage attached to the cutters and the outward clinch members which act, respectively, to cut and then outwardly clinch the remaining lead portion beneath a circuit board.

8 Claims, 9 Drawing Figures

FIG I

INVENTORS

ROBERT H. HOLMES
ALBERT W. ZEMEK

BY Fidelman, Wolffe & Leitner
ATTORNEYS

INVENTORS

ROBERT H. HOLMES
ALBERT W. ZEMEK

BY Fidelman, Wolffe & Leitner
ATTORNEYS

INVENTORS

ROBERT H. HOLMES
ALBERT W. ZEMEK

BY Fidelman, Wolffe & Leitner
ATTORNEYS

INVENTORS

ROBERT H. HOLMES
ALBERT W. ZEMEK

BY Fidelman, Wolffe & Leitner

INVENTORS

ROBERT H. HOLMES
ALBERT W. ZEMEK

BY Fidelman, Wolffe & Leitner

INVENTORS

ROBERT H. HOLMES
ALBERT W. ZEMEK

BY Fidelman, Wolffe & Leitner
ATTORNEYS

LEAD CUT AND OUTWARD CLINCH MECHANISM

This invention is an improvement over the electronic component lead cut and clinch mechanism shown and disclosed in co-pending application Ser. No. 876,726 entitled "MULTI-SIZE DUEL CENTER DISTANCE ELECTRONIC COMPONENT INSERTION MACHINE" filed Nov. 14, 1969, now U.S. Pat. No. 3,593,404 and co-pending application Ser. No. 70,367 entitled "LEAD CUT AND CLINCH MECHANISM" and filed on Sept. 8, 1970, now U.S. Pat. No. 3,646,659. The contents of those co-pending applications are hereby incorporated by reference.

In the industry of electronic component assembly and insertion, a major step comprises inserting components into circuit boards and severing the extra lead material (needed for handling and processing of the components up to the insertion stage) and clinching the remaining leads underneath the circuit board.

Heretofore, numerous devices have been designed to accomplish the cutting and clinching function. However, none of these have provided an outwardly clinched lead. The advantage in having an outwardly clinched lead is that the component may, upon malfunction, be separately pulled from the circuit board and a new component inserted therefor. This is accomplished due to the outwardly biasing of the leads and the fact that the tension on the leads tends to maintain the component in the circuit board rather than the actual clinched portion of the lead. Up to now, the leads have been inwardly clinched which necessitates prying the leads loose with a hand tool before removing a malfunctioning component. Such an operation tends to destroy the leads of the component and surrounding connections. With outwardly biased leads, it is possible to merely insert the component into a circuit board having a printed circuit on the bottom thereof without the necessity of soldering the leads to the printed circuit material. Thus, with the outward clinch, The components are essentially snapped into place and may be removed simply by pulling upwardly on a component body to pull the malfunctioning component off the board and replace it with a new component.

The main advantage in outward clinch is the excellent holding in place of the component with a minimum of lead forming. This reduced greatly the danger of solder bridging from the lead to other board circuitry.

Another major problem in the past has been adjustment of the clinch mechanism. In most cases, the circuit board has to be adjusted to the hight of the cutting mechanism. The problem was further complicated by the fact that the cutter may be required to sever different lengths of leads extending downwardly from a circuit board.

The present invention overcomes all of the disadvantages heretofore discussed and experienced in existing cut and clinch mechanisms. Generally, it consists of a linkage assembly mounted on a vertical slide block, the linkage assembly and slide block all being powered by one binary pneumatic cylinder. The linkage assembly operates in two stages and initially positions the mechanism beneath the circuit board, then actuates the cutter, which first cuts the leads then clinches. The degree of clinch is determined by the length of movement. The remaining lead portions are easily disposed of through escape chutes connected to suction hoses.

According, it is an object of the present invention to provide an electronic component lead severing and outwardly clinching mechanism which overcomes all of the previously discussed disadvantages of the various apparatuses presently available.

It is a more specific object of this invention to provide a novel lead cut and outward clinch mechanism which is capable of severing long leads and leads of varying sizes.

It is a further object of this invention to provide an electronic component lead cutting and outwardly clinching mechanism which is adjustable as to its initial movement and the location of its stroke.

Furthermore, it is an object of this invention to provide a novel lead and outward clinch mechanism which is essentially jam-proof and where the severed lead portions are automatically disposed of.

A further object of this invention is to provide a lead cut and outward clinch mechanism which is powered by one binary pneumatic cylinder and attains all its functions through cams and an eccentric linkage mechanism.

These and other objects of the invention will be readily apparent during the following detailed discussion taken with reference to the drawings in which.

Figures 5, 5A:
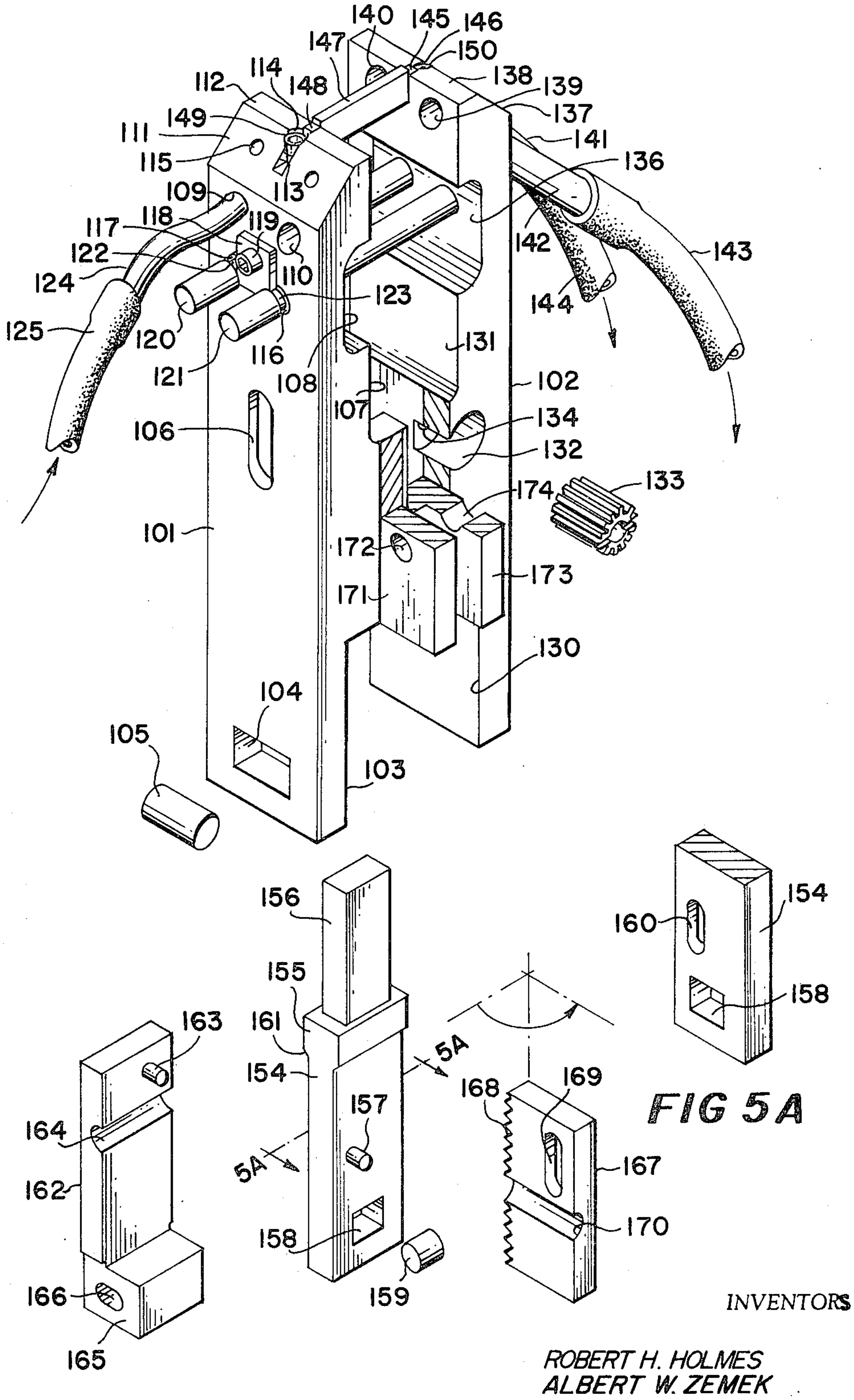
FIG. 5 is an exploded isometric view showing the details of the slide block and rack and cam members.
Figures 6, 7, 8:
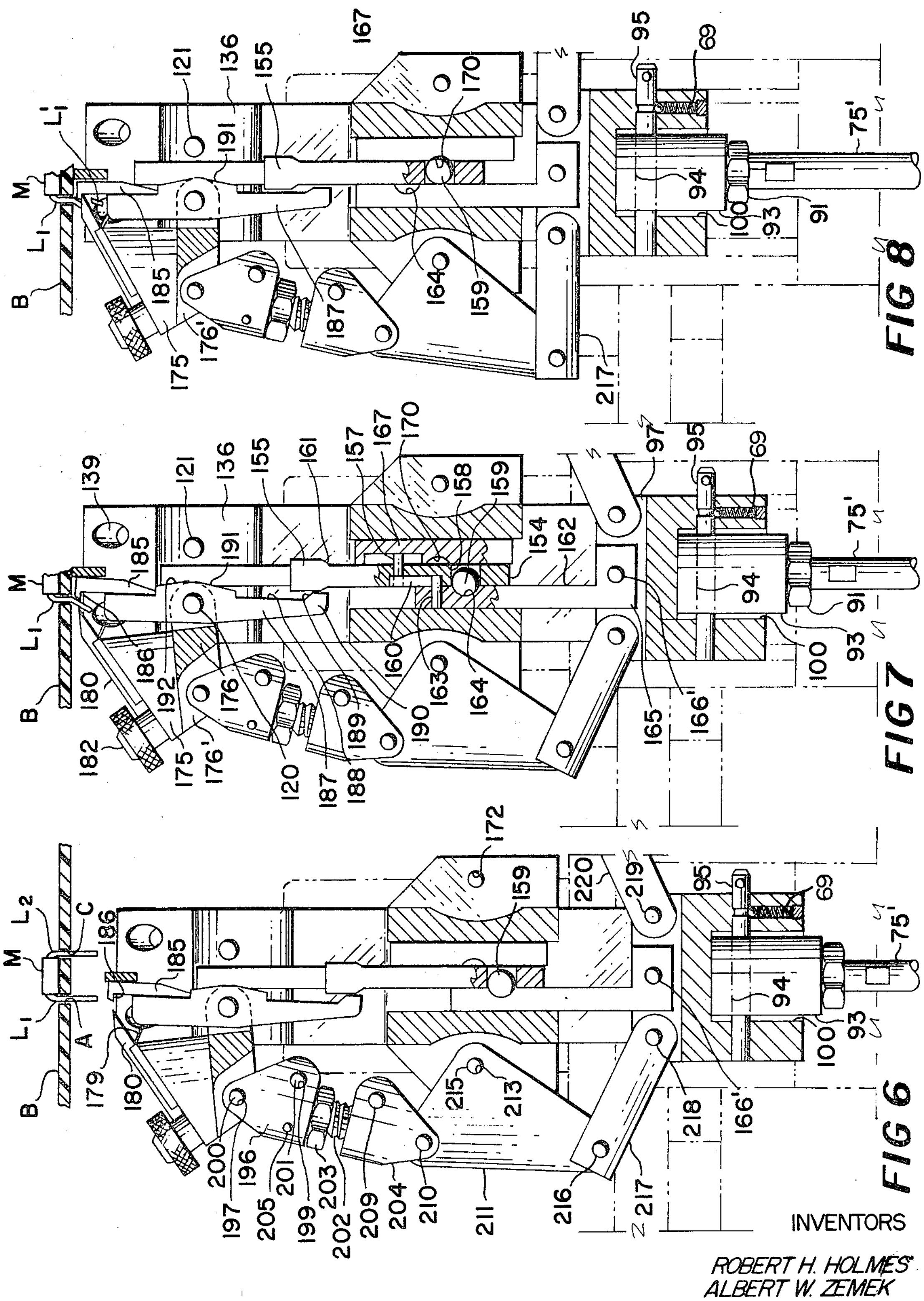

FIG. 5*a* is a perspective view of the rack member shown in FIG. 5;

FIGS. 6–8 show one-half of the cut and outward clinch mechanism, partially in section, from a front view to show the three operating stages of the slide and linkage mechanisms.

Figure 1:
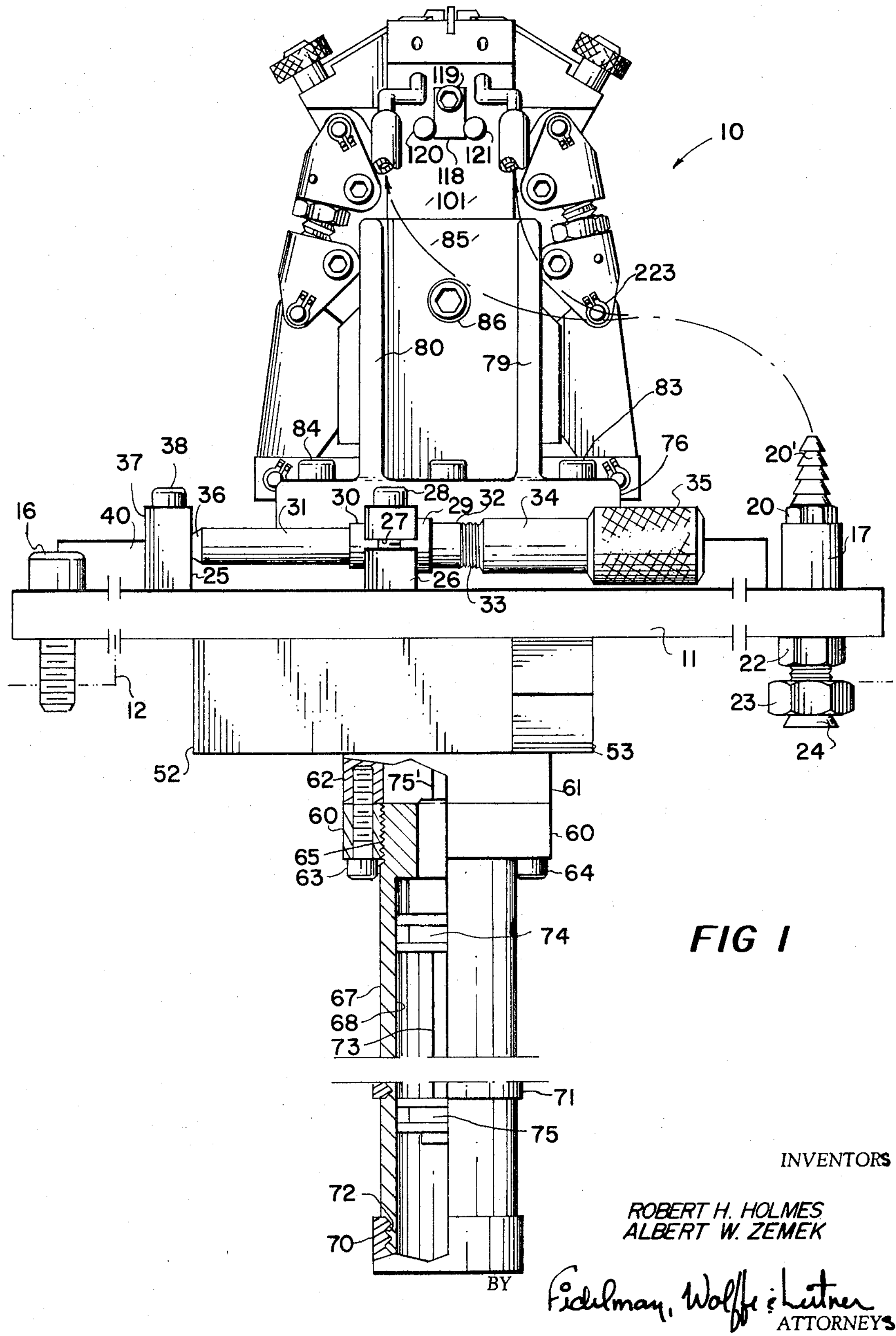
FIG. 1 is a front view of the cut and outward clinch mechanism of this invention, showing the general relationship of the various portions thereof.
Figure 2:
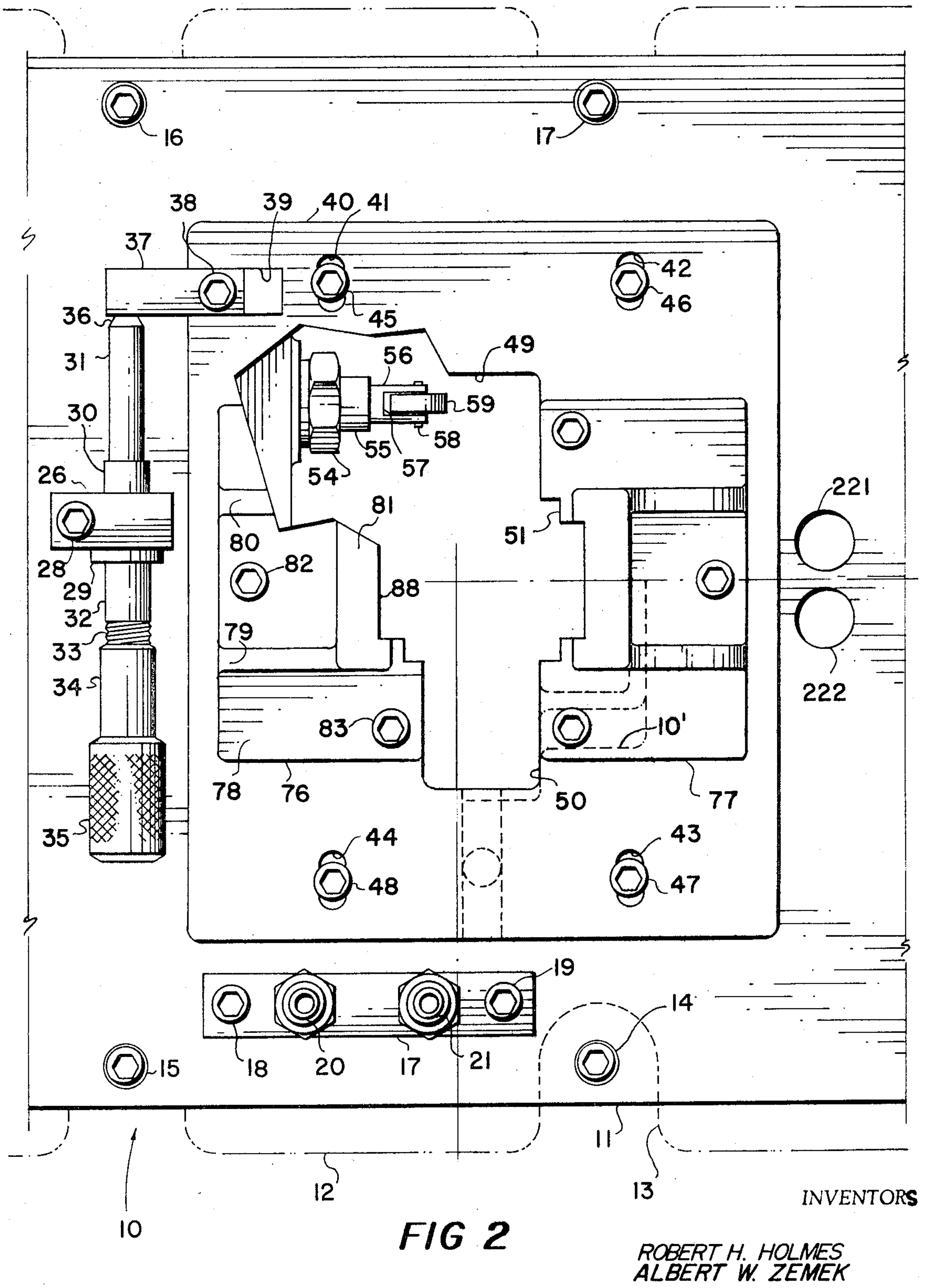
FIG. 2 is a plan view, partially broken away, of the device shown in FIG. 1, but with the main cut and clinch mechanism removed so as to show the support members and their relationship.

Referring now to FIG. 1, the overall cut and clinch mechanism is shown designated generally as 10. The mechanism is mounted on a horizontally disposed table member 11 which is adapted to be secured to a floor mounted support shown in phantom lines 12. Referring to FIG. 2, it is seen that support member 12 has tab portions 13 which extend beneath table 11 whereby bolts or machine screws such as 14, 15, 16 and 17 may be employed to secure the table to the support member.

Mounted atop table 11 is a pneumatic control block 17 secured to table 11 by machine screws 18 and 19 and having fittings 20 and 21. Ear fitting 20 is identical to ear fitting 21 and is shown in more detail in FIG. 1 having a nipple portion 20', a lower hex body 22, a flanged portion for receiving an air hose 24, and an adjustable nut 23 which is used to clamp the air hose over flange portion 24.

A split ring mounting 26 is positioned atop table 11 and has a split portion 27 which merges with an aperture portion (not shown) and which may be tightened by turning machine screw 28. Received within the aperture of 26 is a cylindrical portion 29 with a micrometer 34. Micrometer 34 has reduced cylindrical portion 32 fitting into portion 29, a screw thread portion 33, another reduced cylindrical portion 30, a shaft portion 31, and an abutment head 35. Micrometer 34 also has a knurled adjustment knob 35 by which the position of head 36 may be determined.

Head 36 abuts against a face 25 of a bearing block 37 which is held within a slot 39 of an adjustment plate 40 by a machine screw 38. Adjustment plate 40 contains elongated openings 41, 42, 43 and 44. A series of machine screws 45, 46, 47 and 48 mount the adjustment plate 40 to table 11. Prior to fixedly securing plate 40 to table 11, the desired position of the plate 40 in relation to table 11 and the circuit board (not shown) is determined by turning micrometer adjustment knob 35 until the desired position is reached. This affords a very precise positioning of the entire cut and clinch mechanism. When the desired position is reached, one merely tightens machine screws 45, 46, 47 and 48 to thus lock adjustment plate 40 in the desired position.

Table 11 is cut away beneath adjustment plate 40 as at 10' and adjustment plate 40, shown partially broken away, has opposed cutout areas 49 and 50 in intermediate opposed cutout areas such as 51.

Figure 3:
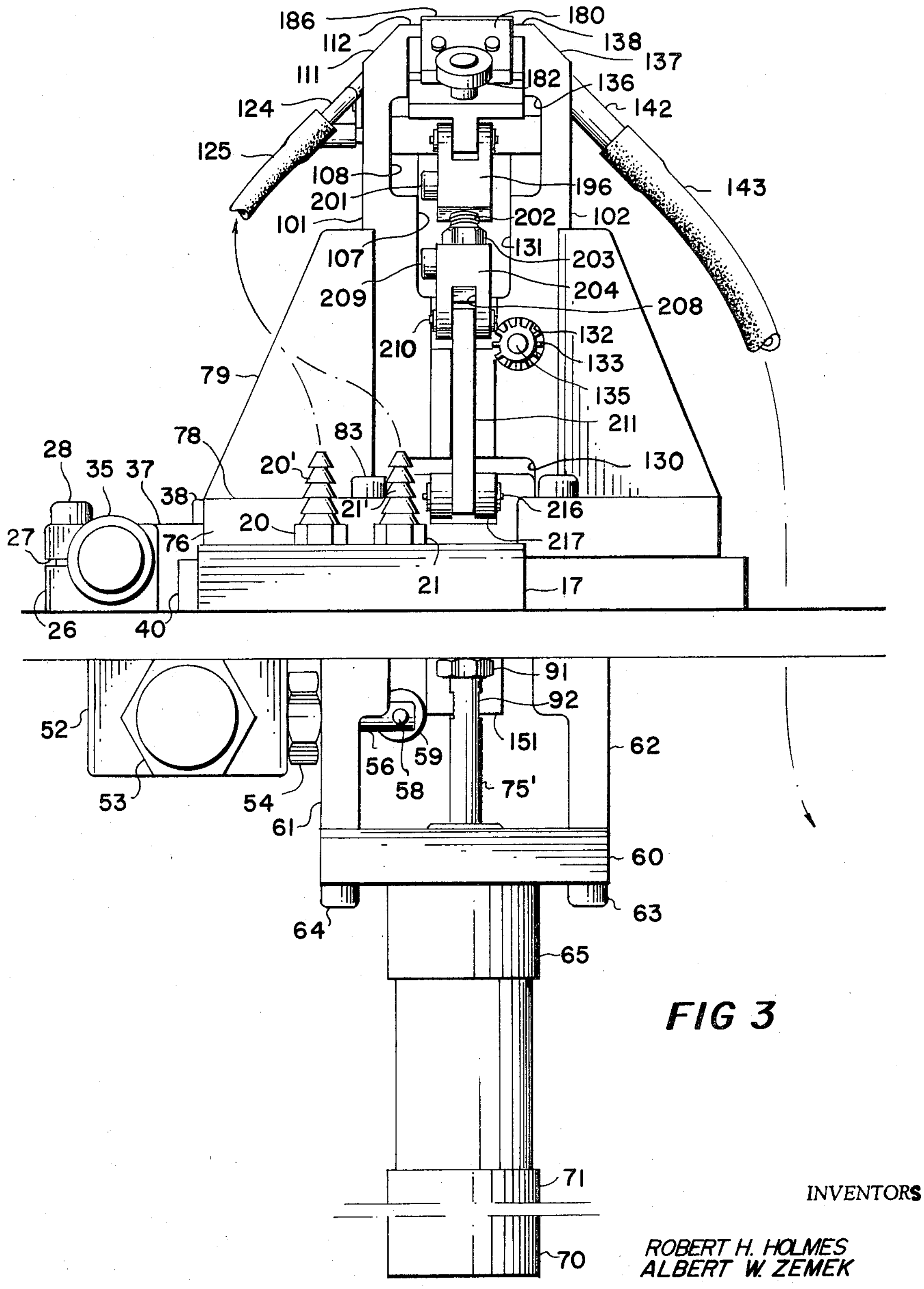
FIG. 3 is a side view of the cut and outward clinch mechanism shown in FIG. 1, showing the relationships of various support members.

Referring now to FIG. 3, there is shown mounted beneath table 11, by any suitable means, a support block 52 with fitting 53 and nut 54 thereon. Nut 54 secures a shaft 55, shown in FIG. 2, which carries a yoke 57 having a shaft 58 therethrough with a wheel 59 mounted thereon.

Member 52 contains a microswitch which is actuated by a portion of the slide block (later to be described) engaging wheel 59 and forcing shaft 55 inwardly to actuate an electrical switch mechanism.

Referring now to FIGS. 1 and 3, there is shown a piston support plate 60 being secured to two depending flange portions 61 and 62 by machine screws 64 and 63, respectively. A cylinder 67 having an external thread 65 is screw mounted to plate 60 and is provided with an internal bore as at 68. A piston rod 75' is connected to the upper portion 74 of the double-acting piston 73. Piston 73 has a lower portion 75 which moves within housing 71, the end of housing 71 having a hub 70 internally threaded as at 72 thereby sealing off the end of the piston. The piston 73 is actuated by air being admitted at either end and this can be done in several conventional ways and is not shown.

Figure 4:
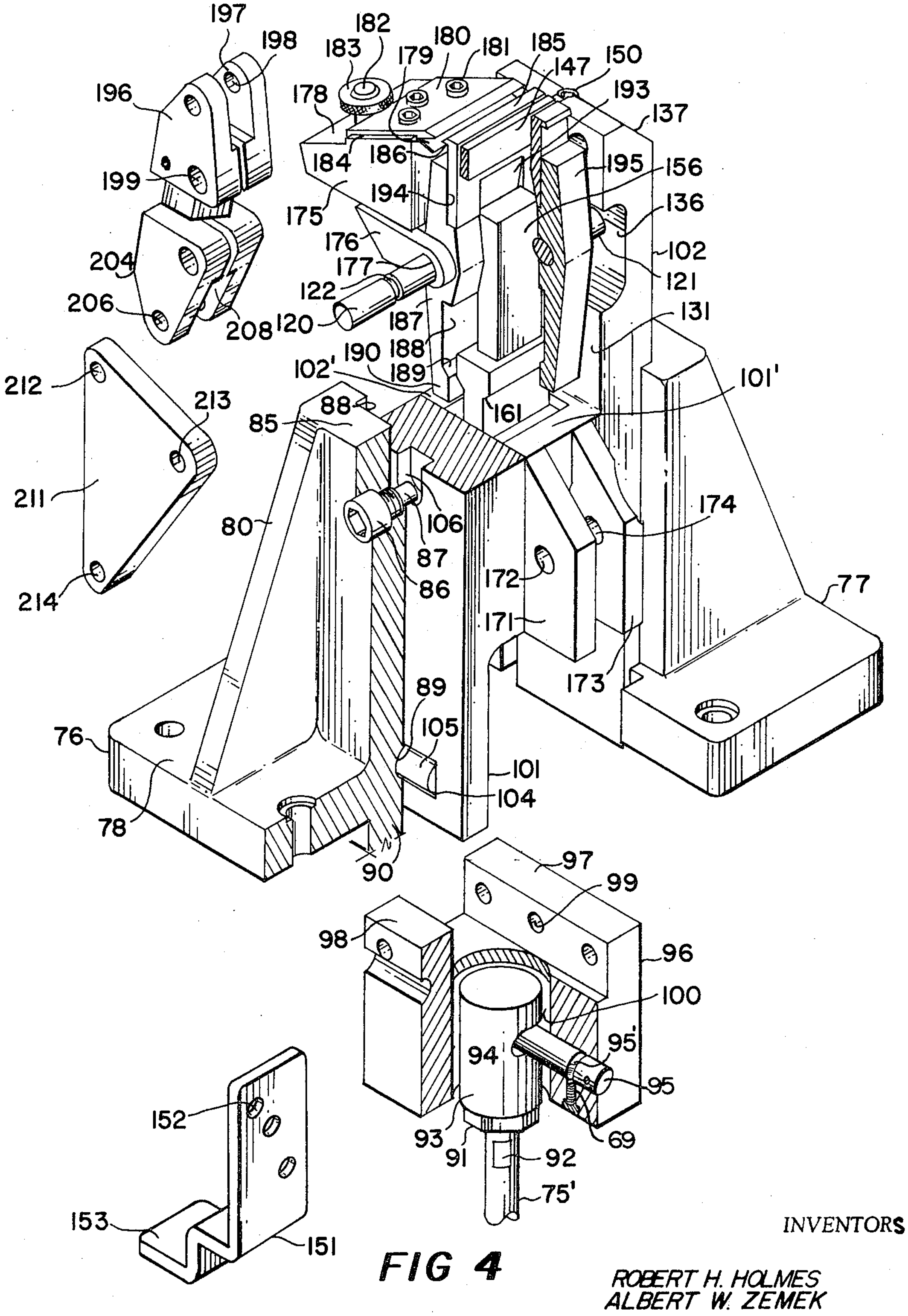
FIG. 4 is an exploded isometric view of the cut and outward clinch mechanism and the various guide, clinch, cam and linkage members and their relationship to each other.

Piston rod 75' extends upwardly from the piston 73 and has a cut-away portion 92 and is externally threaded at the uppermost extremity thereof to receive a block member 93 which is locked in place by nut 91. Block 93 has a channel 94 cut therein which receives a dowel 95 as shown in FIG. 4. Pin 95 locks piston block 93 within a drive member 96. Pin 95 is provided with groove 95' into which spring actuated ball plunger 69 is urged. Drive member 96 has upwardly extending flange portions 97 and 98 which has a series of bores such as 99 therein. The lower portion of 96 is bored as at 100 to receive piston block 93. FIGS. 6 through 8 show the relationship of the piston block and pin 95 within member 96.

As shown in FIG. 4, mounted directly above member 96 is a slide block 101. The slide block is mounted for vertical sliding movement within guide members 76 and 77, as shown in both FIGS. 2 and 4. FIGS. 1 and 3 also show details of the guide members. Essentially, the guide members 76 and 77 are identical; only the former will be described in any detail. Guide member 76 consists of a flat plate section 78 having a pair of angularly extending web portions 79 and 80 which terminate in a vertical portion 85 disposed at essentially right angles to portion 78. A series of bolts, such as 82 and 83, as shown in FIG. 2, secure the guide member to adjustment plate 40. The rear of portion 85 has a groove rectangular cross section 88 thereon. Groove 88 has a corresponding juxtaposed counterpart in guide member 77 as shown in FIG. 2. Portion 85 has a bore therein which receives a machine bolt 86 having a guide pin portion 87. The lower portion of portion 85 extends downwardly as at 90 beyond the level of adjustment plate 40.

A slide block has, as shown in FIG. 5, two substantially identical portions 101 and 102 which are joined together by webs 101' and 102' as shown in FIG. 4. In other words, it is an integral block. Portion 101 has a lower depending portion 103 which has a rectangular cut out area 104 therein adapted to receive roll 105. Located midway up portion 101 is a groove 106 adapted to receive the projecting pin portion 87 of machine screw 86. This limits the travel of side block 101 and causes the roll to detent. Portion 101, as shown in FIG. 5, is cut away at 107 and further relieved at 108. The uppermost portion of 101 has a pair of slanted bores 109 and 110 therein and has a beveled face portion 111 and an upper planar edge portion 112. A notch 113 is cut through 111 and 112 and is bored as at 114. Bevel face 111 has a pair of additional apertures, such as 115, located therein, which are formed during manufacture to provide inner passage between the air supply and the scrap chutes to be described later. These apertures are sealed along the outer portion of the face 111 to insure air passage only to the scrap chutes. Relieved area 108 has a pair of bores 116 and 117 therein. A retaining plate 118 is secured to portion 101 by small diameter screw 119. Received in bores 116 and 117 are a pair of roll pins 120 and 121 having grooved areas 122 and 123 adapted mutually to receive the edges of retaining plate 118.

In FIG. 5, bore 109 is shown receiving tubing 124 which in turn is connected to a suction hose 125. Bore 110 also receives a similar tubing in conduit but is not shown for purposes of clarity.

Portion 102 has a lower depending portion 130 and is relieved as at 131 and further relieved as at 136. Also located within portion 102 is a cylindrical bored area 132 and a small diameter bore 134. Area 132 is adapted to receive gear 133 and a screw (not shown) which secures it by tightening the screw within the small diameter bore 134 to the correct position. Relieved areas 131 and 136 are complementary to relieved areas 107 and 108, respectively. The screw 135 is shown in FIG. 3 but not shown in FIG. 5. The upper end of portion 102 has a beveled face 137 and an upper planar face 138 is shown in FIGS. 3 and 5. Also contained in the upper area of portion 102 are evacuation bores 139 and 140 which receive evacuation conduits 141 and 142 coupled to evacuation hoses 144 and 143, respectively. A slot 146 is cut through beveled face 137 and planar face 138 and corresponds to slot 113 is beveled face 111 and planar face 112 in portion 101. Located in the slots and spanning the distance between them is a clinch member support 147 having notched areas 145 and 148 at the edges thereof and which is held in place by screws 150 and 149 located within bored areas such as 114 in planar face 112.

Referring now to FIG. 4, a bracket 151 is shown having a lower depending portion 153 and a series of apertures 152. Bracket 151 is secured to member 96 and is adapted to engage the wheel on microswitch 52.

Referring now to FIG. 5, there is shown a cam member 154 is exploded view having an enlarged portion 155 and a reduced projecting actuator member portion 156. Located on the face of member 154 is pin 157 and cut-out rectangular area 158 adapted to receive pin 159. A camming surface 161 is located between portion 154 and enlarged portion 155 and is best shown in side view in FIGS. 6 through 8. FIG. **5*a* shows the other side of portion 154 and again shows that area 158 and also shows a slot 160. Slot 160 is adapted to receive a pin 163 on drive member 162, as shown in FIG. 5. Drive member 162 has a lower enlarged portion 165 with an oval shaped aperture 166 located therein. A groove 164 is also located on drive member 162 on the same face as pin 163**.

Pin 157 on cam member 154 is adapted to engage a slot 169 on rack member 167. Rack member 167 has a semicircular groove 170 located beneath slot 169 and is serrated along one edge to provide teeth such as 168. Teeth 168 are adapted to engage gear 133 in portion 102 as rack member 167 moves up and down vertically. The interrelationship of cam member 154, drive member 162 and rack member 157 is thus shown in FIGS. 6 through 8. As is noticeable from those Figures, pin 159 changes position as the mechanism is advanced upwardly.

It is understood that the function of gear 133 and rack 167 adjust the degree of lead spread by adjusting the vertical stroke of member 154. The higher rack 167 goes, the further member 154 travels up and the further out the leads are spread. When groove 170 lines up with roll 159, member 154 stops.

Slide block member 101 has a pair of linkage supporting projections on each side thereof and since they are identical, only one side is described. That side is shown in FIG. 5 and consists of projections 171 and 173 having bores 172 and 174 located therein respectively.

Referring now to FIG. 4, the mechanism is shown in cut-away perspective isometric view to show various components and details of the operation and mechanism. Member portion 101 of the slide block is shown as cut away to show a cutter support member 175 which is triangular shaped and has a pair of projecting wing portions such as 176 which are relieved as shown in FIGS. 6 through 8. Wing portion 176 has a bore 177 which receives pin 120 on which it is adapted to rotate. Inner support member 175 has upper face 178 and is grooved as at 184 to receive cutter 180. Cutter 180 is secured to face 178 by small machine screws such as 181. Plate 179 is mounted on the top corner of face 178 and prevents severed lead portions from falling down within the mechanism. If desired, a cutter blade adjustment knob 183 lockable by screw 182 can be provided to accurately locate cutter blade 180 on face 178. A pair of clinch members such as 186 are provided within the mechanism on each side of the clinch support member 147. In FIG. 4, only one clinch member is shown and it has an upwardly widened extending portion 185. Portion 185 has a clinching projection 186 as shown in FIG. 4. A pivotal cam member 187 is also received on pin 120 and is adapted to rotate thereon and has a relieved area 188 merging into a camming portion 190 and having a camming face or surface 189. The upper end of cam 187 is relieved as at 194 to support clinch member 185. As is shown in FIG. 4, the rear face of clinch member 185 is relieved as at 193 to accommodate actuator portion 156 of cam member 154. The other clinch member is shown as 193' in section and a sectional portion of the other pivotal cam member is shown as at 195. As shown in FIG. 4, cam face 189 of pivotal cam member 187 coacts with cam surface 161 of cam member 154.

Referring now to FIGS. 4 and 6 through 8, there is shown a pair of link members 196 and 204. Link member 196 has a grooved area 197 and a pair of apertures such as 198. Member 196 is a split type member and has a further aperture as at 199. Referring now to FIG. 6, there is shown a pin 200 securing link member 196 to cutter support member 175 and the end of a machine screw 201 which fastens the portions of member 196 together. Member 204 is constructed similarly to member 196 and has a slotted area 208 adapted to receive a pivotal link 211 and further has a pair of apertures, such as 206. A pin 210 passes through apertures 206 and member 204, and aperture 212 and member 211 to secure those members together. Located between members 196 and 204 is an adjustment screw 202 including nut portion 203. Adjustment of screw 202 by nut 203 determines the location of stroke of the cutting mechanism. The end of a machine screw 209 is seen in FIG. 6 and is used to tighten the portions of member 204 together. Pivotal link member 211 is secured within an aperture similar to 172 of projection 171 by a pin 215 passing through aperture 213 in the link member. The pin 216 secures a link bar 217 to link member 211 and passes through aperture 214. Link bar 217 is fastened to block member 96 by pin 218 passing through the link bar in apertures such as 99 in member 96. It is to be understood that while only one side of the mechanism has been shown, the linkage assembly, the clinch members and the cutter arrangement are identical on either side of the mechanism. A link bar 220 is shown in FIGS. 6 and 7 and is connected to member 96 by pin 219.

A pin 166', as shown in FIG. 6, secures drive member 162 to block member 96. As shown in FIG. 5, pin 163 resides in slot 160 of cam member 154 and pin 157 of cam member 154 resides in slot 169 of rack member 167. The pins are used to guarantee the rolls locking into the grooves. As shown in FIG. 6, the mechanism is positioned at the beginning of its stroke and located beneath a circuit board B. The circuit board is shown as having apertures A and C in which are located leads $L_1$ and $L_2$ of a module M. As is noticed from a perusal of FIG. 6, the linkage is in its retracted position, the clinch member 185 is shown in a relaxed condition, and the cutter blade 180 is shown in retracted position.

When the piston rod 75' is actuated by the piston assembly 71, the entire mechanism moves upwardly, in other words, slide block 101 moves up within guide members 76 and 77. Roll 105 dropping into groove 89 locks block 101 in place which takes place during the first binary cylindrical movement.

FIG. 7 shows the position of the uppermost point of slide block movement. In this position, pin 163 is shown at the lower extremity of slot 160 and pin 157 is shown midway in slot 169. During this upward movement, roll pin 159 has been partially located within cut-out area 158 of the cam member 154 and in groove 164 of drive member 162. Further upward movement of member 96 caused by the piston forces the roll pin 159 to come out of groove 164 and partially enter groove 170 in rack member 167. During this upward movement, cam surface 161 of cam member 154 has not yet engaged cam surface 189 of pivotal cam member 187. As movement continues upwardly, the slide block ceases upward movement but the drive member and cam member 154 continue upwardly. As is shown in FIG. 8, the cam surfaces 189 and 161 have slid over each other and allowed cam member 187 to pivot slightly counterclockwise. At the same time, the actuator portion 156 of cam member 154 is engaging the relieved area 193 of clinch member 185 and forcing clinch member 185 away from clinch member support 147. Simultaneously with the movement of the clinch member 185, the continued upward movement of the cam member 154 and its accompanying actuator portion 156 has caused the linkage assembly, namely link bar 217, pivotal line 211, and line members 96 and 204, to pivot cutter support member 175 clockwise slightly, thereby forcing cutter blade 180 against the lead. Actually, the edge of cutter blade 180 is forced against the lead $L_1$ prior to actuator portion 156 of cam member 154 engaging clinch member 185, thereby cutting the lead before any clinching takes place. Immediately after the cutting of lead $L_1$, the clinch member 185 is actuated to push the lead outwardly and up against the bottom of the circuit board B, as shown in FIG. 8 to thus bias or tension the lead within aperture A of circuit board B.

At the commencement of the cycle the piston carrying member 96 moves up a predetermined amount thereby carrying member 101 upwards until the groove 106 contacts stop screw 87 at which time roller 105 locks into groove 89 in member 78. Block 101 travels far enough to take the two roll grooves out of alignment and locks roll 105 in groove 89. This movement places the anvil under the board for support.

When the air valve is energized to actuate the front portion of the binary cylinder, block 101 will remain locked in place. Member 154 will continue its upward movement through cam plate 187 causing member 185 to spread outward forming the leads. The degree of form is governed by the location of the groove 170 in rack 167. The higher up the groove is placed, using the screwdriver slot in pinion adjustment 133, the greater the spread. A screw (not shown) locks the pinion in place.

While the cam has been moving and locking in place, the cutter blade 180 have also been advancing. They will now move up to the full stroke of the cylinder at which time the links come to full toggle.

By using adjustment screw 202 for positioning the end of the cutter stroke, leads may be severed with proper forming.

At this point, a switch is made which actuates valves for both sections of the binary piston and cylinder and returns the entire clinch unit to its home or lowermost position.

The cut-off portion of the lead is prevented from falling into the body of the mechanism by plates, such as 179 and then evacuated by air pressure coming through hoses such as 125 and ports such as 143 and 144 carry the ejected parts out.

The mechanism then retracts, moves to a new predetermined position and the cycle is repeated.

While only one embodiment of the invention has been shown and described, it is obvious that many changes and modifications will be apparent to those of ordinary skill in the art without departing from the scope of the appended claims. For example, the entire assembly may be suspended from "L" brackets through which double position screw supports may be placed allowing the C & C assembly to be lowered sufficiently to clear component leads not requiring cutting and clinching.

What is claimed is:

1. An apparatus for cutting and outwardly clinching leads of components projecting beneath circuit boards, said apparatus comprising at least one housing support member, an anvil assembly mounted for vertical movement on said support member, lead cutting and outwardly clinching means on said anvil assembly, a slide block means in said anvil assembly having a cam means and a linkage means thereon, said cutting means actuated by said linkage means and said outward clinching means actuated by said cam means, a first piston means for initially moving said anvil assembly vertically to place said cutting means in position to cut and clinch leads prior to said cutting and clinching and for subsequently moving said slide block means to activate said cutting means and clinching means, means adapted to carry said severed lead portions away from said cutting and clinching means.

2. An apparatus as in claim 1 wherein said cutting means comprises pivotable members having cutting blades thereon and said clinching means comprises a pair of supported members adapted to be moved in a direction opposite to that direction in which the pivotable members pivot.

3. An apparatus for cutting and outwardly clinching downwardly depending leads of electronic components projecting beyond circuit boards, said apparatus comprising a support means, a pair of guide means mounted on said support means, adjustment means to vary the position of said guide means on said support means, slide block means adapted to move vertically within said guide means, a piston means operatively connected with said guide means and adapted to move said slide block means vertically within said guide means, linkage and cam means on said slide means, lead cutting means, lead outwardly clinching means, said linkage and cam means arranged on said slide block means so as to first sever said depending leads and then to outwardly clinch them as said piston means moves said slide block means vertically upward within said guide means.

4. An apparatus as in claim 3 wherein both said linkage and cam means are connected to said piston means.

5. An apparatus as in claim 4 wherein said linkage means comprises a pivotable cutter support member, a cutter blade on said cutter support member comprising said cutting means, and a series of linkage members adapted to pivot said cutter support member when said piston forces said slide block means vertically upward passed a predetermined point.

6. An apparatus as in claim 5 wherein said cam means includes at least three adjacent members, the middle member having a passage therein and the two adjoining members having grooves therein, a roll pin adapted to first ride in the groove of one of said adjoining members and said aperture and said central member, and at a predetermined point in the upward travel of said slide means to shift over in said aperture means in said central member and ride in the groove in said other adjoining member.

7. An apparatus as in claim 3 wherein said outwardly clinching means comprises a pair of planar members having outwardly projecting portions thereon, said cutting means comprising a pair of cutter blades actuated by said linkage means and adapted, during the upward travel of said slide block means, to sever said leads by cutting them off immediately beneath the leads engagement with the projecting portion of said printing planar members.

8. An apparatus as in claim 3 wherein said slide block means is positioned directly beneath the depending leads during the first portion of its upward travel and the leads are positioned between the cutting and clinching means thereon and the remainder of said upward portion of the travel of said slide block means adapted to force said cutter means inwardly and said clinching means outwardly to thereby consecutively cut and outwardly clinch the leads against the printed circuit board.

* * * * *